United States Patent [19]

Fukami

[11] Patent Number: 5,521,489

[45] Date of Patent: May 28, 1996

[54] OVERHEAT DETECTING CIRCUIT

[75] Inventor: Ikuo Fukami, Tokyo, Japan

[73] Assignee: NEC Corporation, Tokyo, Japan

[21] Appl. No.: 299,239

[22] Filed: Aug. 31, 1994

[30] Foreign Application Priority Data

Sep. 1, 1993 [JP] Japan .................... 5-239269

[51] Int. Cl.⁶ ........................... G05F 1/575
[52] U.S. Cl. .................. 323/313; 323/316; 323/907
[58] Field of Search ....................... 323/312, 313, 323/314, 315, 316, 317, 907

[56] References Cited

U.S. PATENT DOCUMENTS

| | | | |
|---|---|---|---|
| 4,238,738 | 12/1980 | Komori | 330/256 |
| 4,636,710 | 1/1987 | Stanojevic | 323/314 |
| 4,868,485 | 9/1989 | Ashizaki | 323/316 |
| 5,061,862 | 10/1991 | Tamagawa | 323/312 |
| 5,063,342 | 11/1991 | Hughes et al. | 323/315 |

FOREIGN PATENT DOCUMENTS 64-15623  1/1989  Japan .
430609   2/1992  Japan .

*Primary Examiner*—Peter S. Wong
*Assistant Examiner*—Shawn Riley

[57] ABSTRACT

An overheat detecting circuit for detecting overheating of an integrated circuit has a band gap voltage source circuit for emitting a substantially constant voltage, which is connected between a positive power source line and a reference power source line. The voltage output from the band gap voltage source circuit is independent of the power source voltages and the ambient temperature. A constant current source circuit is provided for generating a constant current according to the output of the band gap voltage source circuit. At least one circuit element is connected between an output terminal of the constant current source circuit and the reference power source line. The circuit element has a predetermined temperature coefficient. A comparator compares the output voltage of the band gap voltage source circuit with that of the circuit element. Thus, the variation in the detected temperature according to the power source voltage, which is caused by the fluctuation of the element characteristics as the semiconductor integrated circuit is manufactured, is suppressed.

14 Claims, 4 Drawing Sheets

OVERHEAT DETECTING CIRCUIT

FIELD OF THE INVENTION

The present invention relates to a semiconductor integrated circuit and, in particular, to a semiconductor integrated circuit for detecting overheating of a circuit which is great in power consumption.

BACKGROUND OF THE INVENTION

FIG. 3 illustrates a conventional overheat detecting circuit of the foregoing type. As illustrated therein, a MOSFET transistor 31 and a MOSFET transistor 32 constitute a current mirror, a gate terminal and a drain terminal of the MOSFET 31 are each connected to a negative power source $V_{SS}$38 through a resistance 33.

The drain terminal of the MOSFET 32 is connected to negative power source VSS38 through a six-stage diode 34, and the dropping voltage 6VF corresponding to the six-stage diode (VF is a forward voltage of a diode) and the output VR of a band gap voltage source circuit (hereinafter referred to as "BGR circuit", and BGR stand for Band Gap Reference) 35 which is connected between a positive power source $V_{DD}$ and the negative power source $V_{SS}$ are each connected to the input terminal of a comparator 36.

As will be described later, since the output VR of the BGR circuit 35 is generated by synthesizing a $V_{BE}$-dependent type voltage source that is the temperature coefficient of which is negative and a thermal voltage(=kT/q)–dependent type power source voltage that is the temperature coefficient of which is positive, and can be arranged so that it has no temperature coefficient, the output VR becomes constant independently from the fluctuation of the power source voltage and the temperature variation.

A constant current $I_S$ which flows through a resistance $R_{33}$ is given with the resistance value of a resistance 33 taken as $R_{33}$ and with the MOSFETs 31, 32 forming the current mirror having the same characteristics.

$$I_S = [(V_{DD} - V_{SS}) - V_T]/R_{33} \qquad \text{formula (1)}$$

where: $V_T$ denotes an invention voltage or threshold voltage of the MOSFET 31.

The relationship between the dropping voltage 6VF and the output voltage VR of the BGR circuit 35 as this constant current $I_S$ flows through the diode 34 is set so as to satisfy the following condition at the room temperature.

$$VR < 6VF \qquad \text{formula (2)}$$

Since the dropping voltage 6VF has a negative coefficient as the current is made to flow through the diode 34, if the ambient temperature is elevated, then the value of the dropping voltage 6VF is lowered. Therefore, if the temperature rises above a predetermined ambient temperature, then the dropping voltage 6VF becomes less than the output VR of the BGR circuit 35, and an output of a comparator 36 is inverted. Based on the change of the output signal of the comparator 36, the overheated condition of the circuit is detected. In order to protect the integrated circuit, the cut-off control over the circuit operation and the like is carried out by means of a control circuit and the like (not shown).

As the BGR circuit 35, a circuit shown, for example, in FIG. 4, is used. In FIG. 4, at the stably operating point, the differential voltage of the differential amplifier 41 between the inverted input and the non-inverted input becomes zero, with the dropping voltage of the resistances $R_1$ and $R_2$ equaling each other, the currents $I_1$ and $I_2$ satisfying the relationship: $I_1 \times R_1 = I_2 \times R_2$ and the node voltages $V_A$ and $V_B$ equaling each other. Incidentally, in place of the diodes 42, 43 (shown), transistors having the collector and the base connected may be arranged.

If the saturation current of the diode is set to $I_S$, a forward current $V_{BE}$ of the diode is given with (kT/q)Vn (I/Is) from its rectifying characteristic, and the dropping voltage $V_{R2}$ of the resistor $R_2$ is given according to the following formula (3).

$$\begin{aligned} V_{R2} &= (V_A - V_C) \times R_2/R_3 & \text{formula (3)} \\ &= (V_B - V_C) \times R_2/R_3 \\ &= (R_2/R_3) \times 2(kT/q)(\ln I_1/I_S - \ln I_2/I_S) \\ &= (R_2/R_3) \times 2(kT/q)\ln I_1/I_2 \\ &= 2(R_2/R_3) \times (kT/q)\ln R_2/R_2 \end{aligned}$$

where: k: Boltzman's constant, T: absolute temperature, q: amount of electrical charges of electrons.

As illustrated in FIG. 4, the output voltage $V_{out}$ of the BGR circuit becomes a sum of the forward voltage $2V_{BE}$ of the two stage-diode, and the dropping voltage $V_{R1}(=I_1 \times R_1)$ of the resistance $R_1$, and is provided according to the following formula (4). That is, the output voltage $V_{out}$ is given as the synthesis of the $V_{BE}$-dependent type voltage source having the negative temperature coefficient and the thermal voltage-dependent type voltage source having the positive temperature coefficient.

$$\begin{aligned} V_{out} &= 2V_{BE} + I_1R_1 = 2V_{BE} + V_{R2} & \text{formula (4)} \\ &= 2(V_{BE} + (R_2/R_3) \times (kT/q) \times \ln(R_2/R_1)) \end{aligned}$$

When the temperature coefficient of the output voltage $V_{out}$ is set to zero, the output voltage is given according to the following formula (5), and the output of the BGR circuit can be set substantially constant independently of the power source voltage and the temperature.

$$V_{out} = 2V_{GO} + 2V_{TO} \times (\gamma - \alpha) \qquad \text{formula (5)}$$

Here, $V_{GO}$ denotes a band gap voltage of silicon, and equals 1.205 V, and $V_{TO}$ (=$kT_0/q$) denotes the thermal voltage at the temperature of $T_0$ (26 mV at the room temperature) and $\alpha$, $\gamma$ each denotes a predetermined constant.

The foregoing conventional overheat detecting circuit has a disadvantage that the current value $I_S$ of the constant current suffers a variation due to the fluctuating power source voltage and that the detected temperature also fluctuates.

That is, in the foregoing conventional overheat detecting circuit, since the fluctuation of the power source voltage causes the value of $(V_{DD} - V_{SS})$ in the foregoing formula (1) to change, the temperature at which the overheating is detected fluctuates, and a precise overheat detecting is impossible.

Further, in the foregoing conventional overheat detecting circuit, there was a problem of the fluctuation of the detected temperature which is caused by the fluctuation of the element characteristic as occurs when the semiconductor integrated circuit is manufactured and, in particular, the fluctuation and the dispersion of the output voltage VR of the BGR circuit 35 cannot be properly suppressed.

Prior art overheat detecting circuits are described in Japanese Patent Laid-Open Publication Nos. Sho 64-15623, Hei 4-30609. But these prior art publications do not describe the BGR circuit and the like.

SUMMARY OF THE INVENTION

Therefore, an object of the present invention is to eliminate the foregoing problem and to provide an overheat detecting circuit which suppresses the fluctuation of the detected temperature relative to the power source voltage while suppressing the variation of the detected temperature which is caused by the fluctuation of the element characteristic as occurs when the semiconductor integrated circuit is manufactured.

In order to achieve the foregoing object, according to the present invention, there is provided an overheat detecting circuit comprising a band gap voltage source connected between the positive and negative power source lines for emitting a substantially constant voltage independent of the power source voltage and the temperature, a constant current source circuit for generating a constant current from the output of the band gap voltage source circuit, a circuit element having a predetermined temperature coefficient, the circuit element being connected between the output terminal of the constant current source and the negative power source line and a comparator for comparing the output voltage of the band gap voltage source circuit and the voltage generated at the circuit element.

DESCRIPTION OF THE PREFERRED EMBODIMENTS OF THE INVENTION

A specific embodiment of the present invention is hereinafter described with reference to the accompanying drawings.

Embodiment 1

Figure 1:
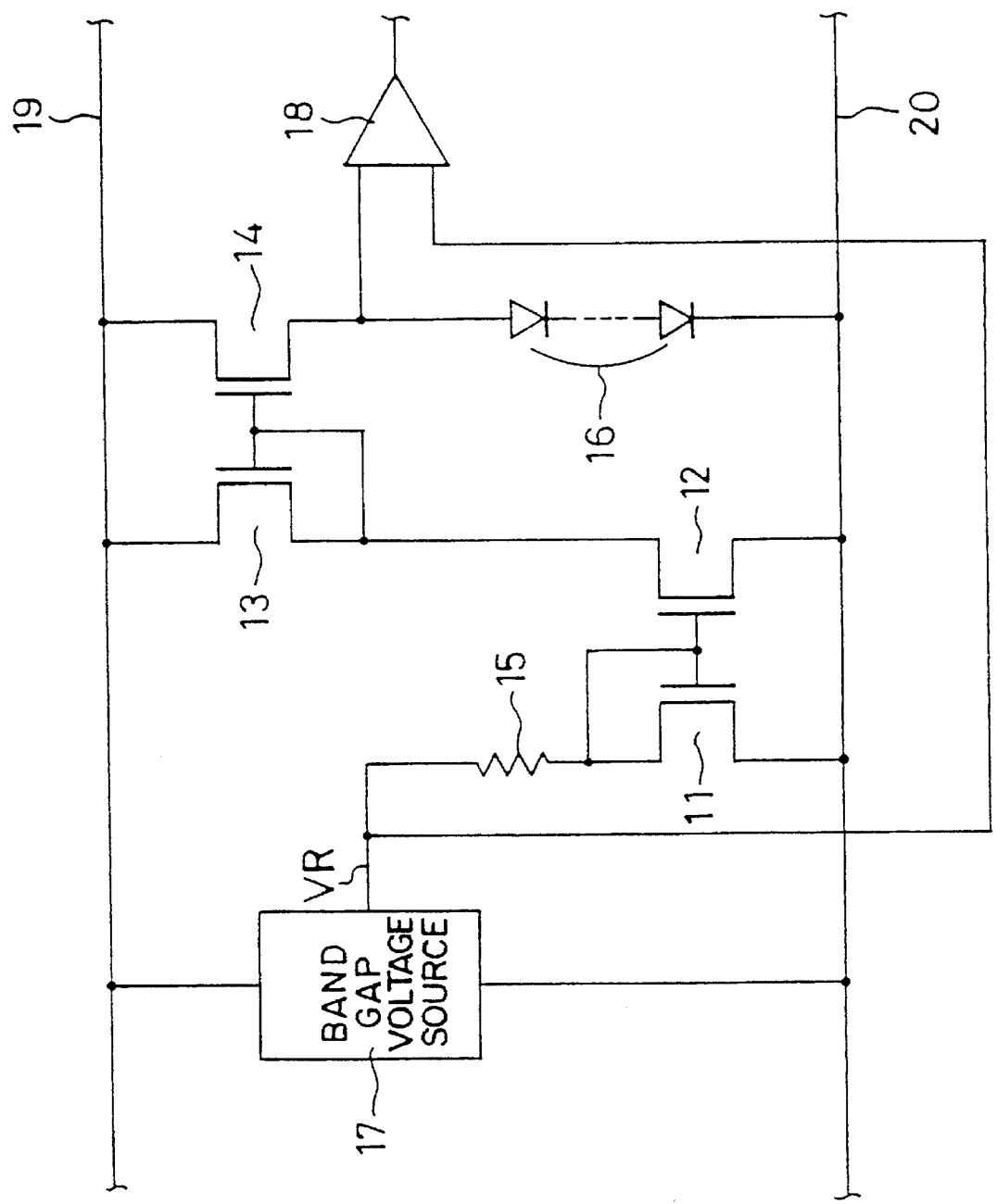
FIG. 1 is a diagram illustrating a circuit arrangement according to a first embodiment of the overheat detecting circuit of the present invention.

Referring to FIG. 1, a first embodiment of the present invention is hereinafter described. FIG. 1 illustrates a circuit arrangement of the overheat detecting circuit according to a specific embodiment of the present invention.

As shown in FIG. 1, in a MOSFET 11, the gate terminal and the drain terminal are each connected, and the source terminal is connected to a negative or reference power source $V_{SS}$ 20. MOSFET 12 constitutes a current mirror together with MOSFET 11, and each MOSFET 11,12 has the same characteristic.

One end of the resistance 15 is connected to the drain terminal of the MOSFET 11, the drain terminal of MOSFET 13 is connected to the drain terminal of MOSFET 12, and the other end of the resistance 15 is connected to the output of the BGR circuit 17.

In a MOSFET 13, the gate terminal and the drain terminal are connected, and its source terminal is connected to a positive power source $V_{DD}$ 19, and each MOSFET 13, 14 has the same characteristic.

Six-stage diodes 16 are connected in series to the drain terminal of MOSFET 14. The voltage 6VF of these six-stage diode and the output VR of the BGR circuit 17 are supplied to the comparator 18.

Figure 4:
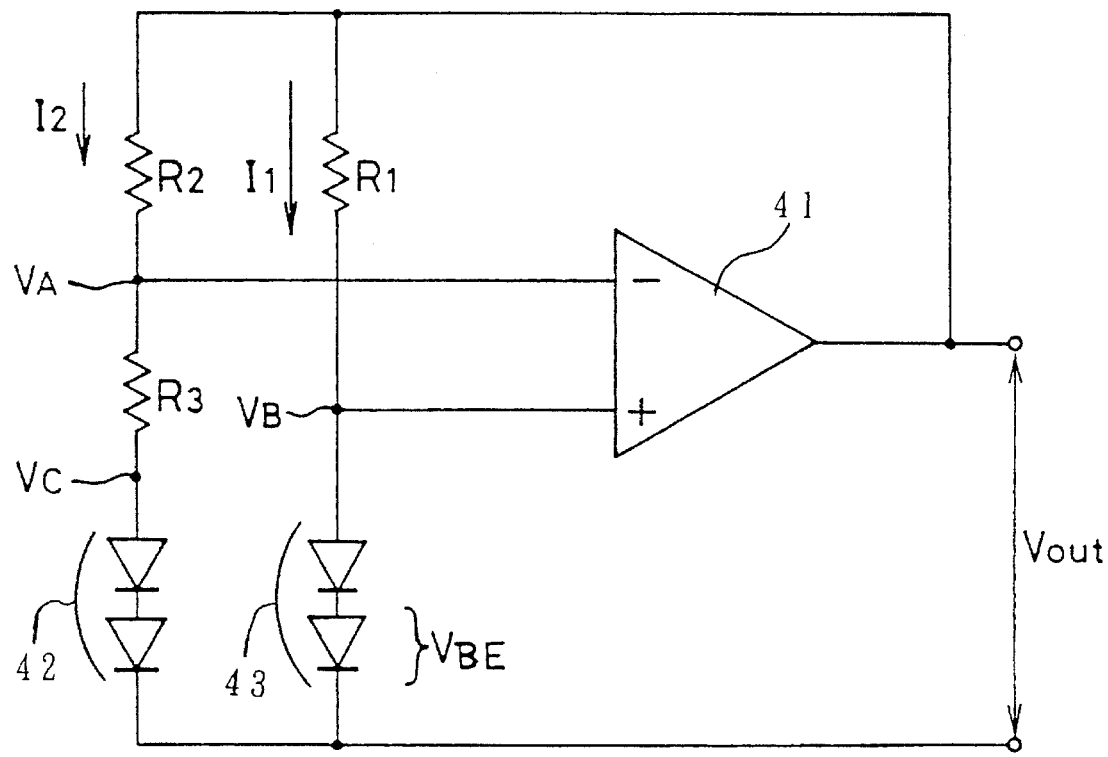
FIG. 4 is a diagram illustrating a specific embodiment of the circuit arrangement of a band gap voltage source circuit.

In the foregoing overheat detecting circuit, BGR circuit 17 uses the foregoing circuit arrangement shown, for example, in FIG. 4, and the output thereof is arranged so as to have no temperature coefficient and always emits a constant voltage VR independently of the ambient temperature, or the power source voltages $V_{SS}$ 20 and $V_{DD}$ 19.

Further, the dropping voltage 6VF of the six-stage diode is given by the voltage value as the circuit current $I_B$ evaluated according to the following formula (5) is made to flow;

$$I_B = (V_R - V_T)/R_{15} \qquad (5)$$

where: $V_T$ denotes a threshold voltage of MOSFET 11.

The relationship between the two voltages VR and 6VF which are applied to the comparator 18 is set as follows at the room temperature.

$$VR < 6VF$$

The dropping voltages of a diode has a negative temperature coefficient and, when the ambient temperature is elevated, the value of the dropping voltage 6VF becomes lower. Therefore, at the point where the dropping voltage 6VF of the diode is lowered as compared with that of the output voltage VR of the BGR circuit 17, the outputs of the comparator 18 is inverted, and the overheat condition is detected.

Incidentally, when the integrated circuit is being manufactured, some variation or dispertion of the output voltage VR of the BGR circuit 17 is often generated by the fluctuation of the element characteristic within the BGR circuit 17. In this case, the forward voltage 6VF of the six-stage diode will fluctuate in the same direction (that is, in same phase) as in the output VR of the BGR circuit 17 according to the foregoing formula (5).

For example, if the output voltage VR of the BGR circuit 17 is increased due the manufacturing process, and the output current of the current mirror is increased as seen from the foregoing formula (5) and the current flowing into the diode 16 is increased, the six-stage forward voltages 6VF of the diodes are increased in same phase with the output voltage VR of the BGR circuit 17. Therefore, the fluctuation of the differential voltage of the comparator 18, which is caused by the variation of the BGR circuit 17, is suppressed, and the fluctuation of the detected temperature can be suppressed to a minimum.

Therefore, the overheat detecting circuit according to this embodiment is extremely effective when circuits such as motor driving circuits, which are great in power consumption or dissipation, are integrated. Incidentally, although, in this embodiment, the voltage drop of the diodes, which are connected six in series, was connected to one input of the comparator 18, the number of stages of the diodes is appropriately set depending on the relationship between the temperature of the overheat detected and the output voltage VR of the BGR circuit 17 and the temperature coefficient of the diode and the like.

Embodiment 2

Figure 2:
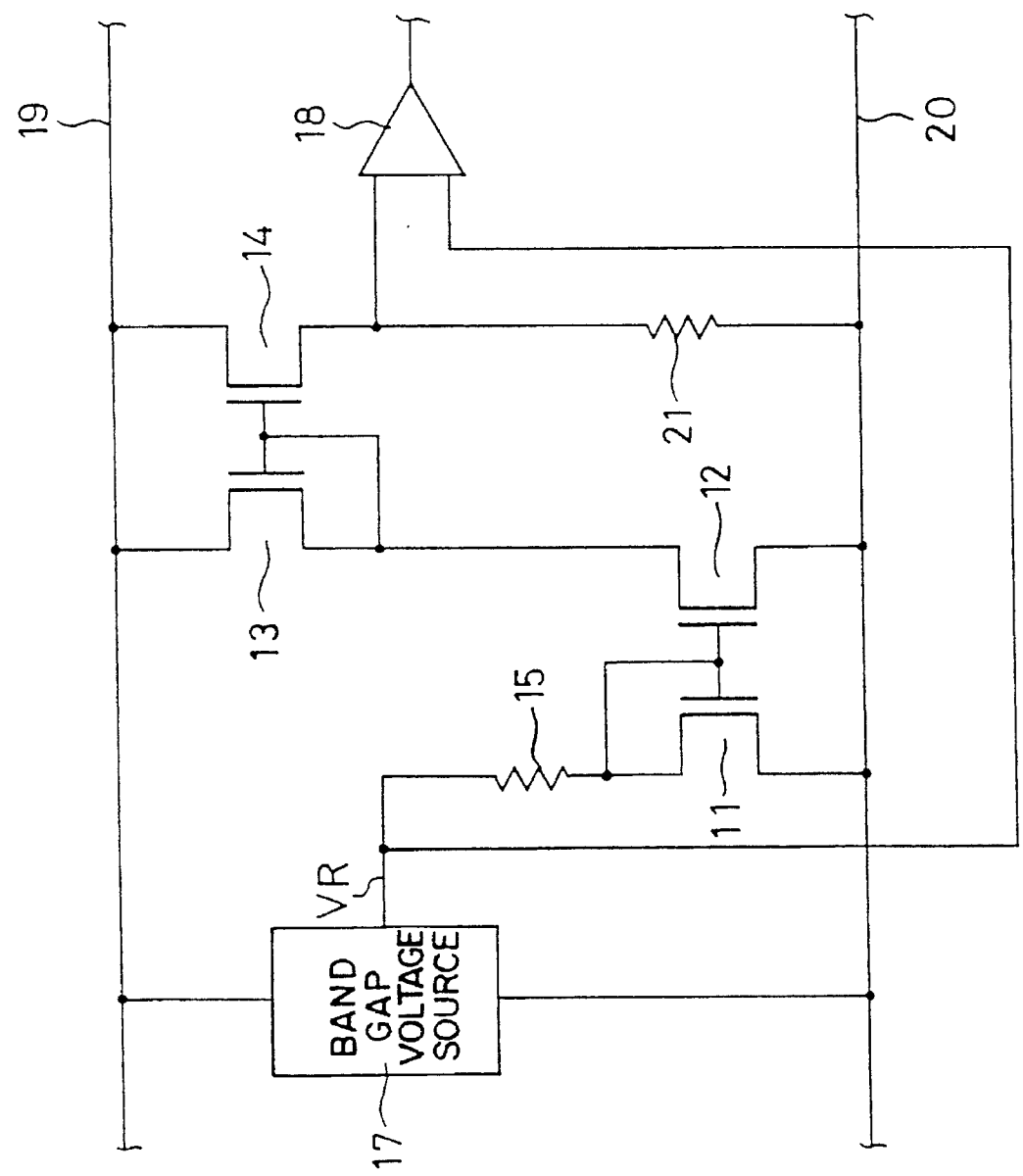
FIG. 2 is a diagram illustrating a circuit arrangement according to a second embodiment of the present invention.
Figure 3:
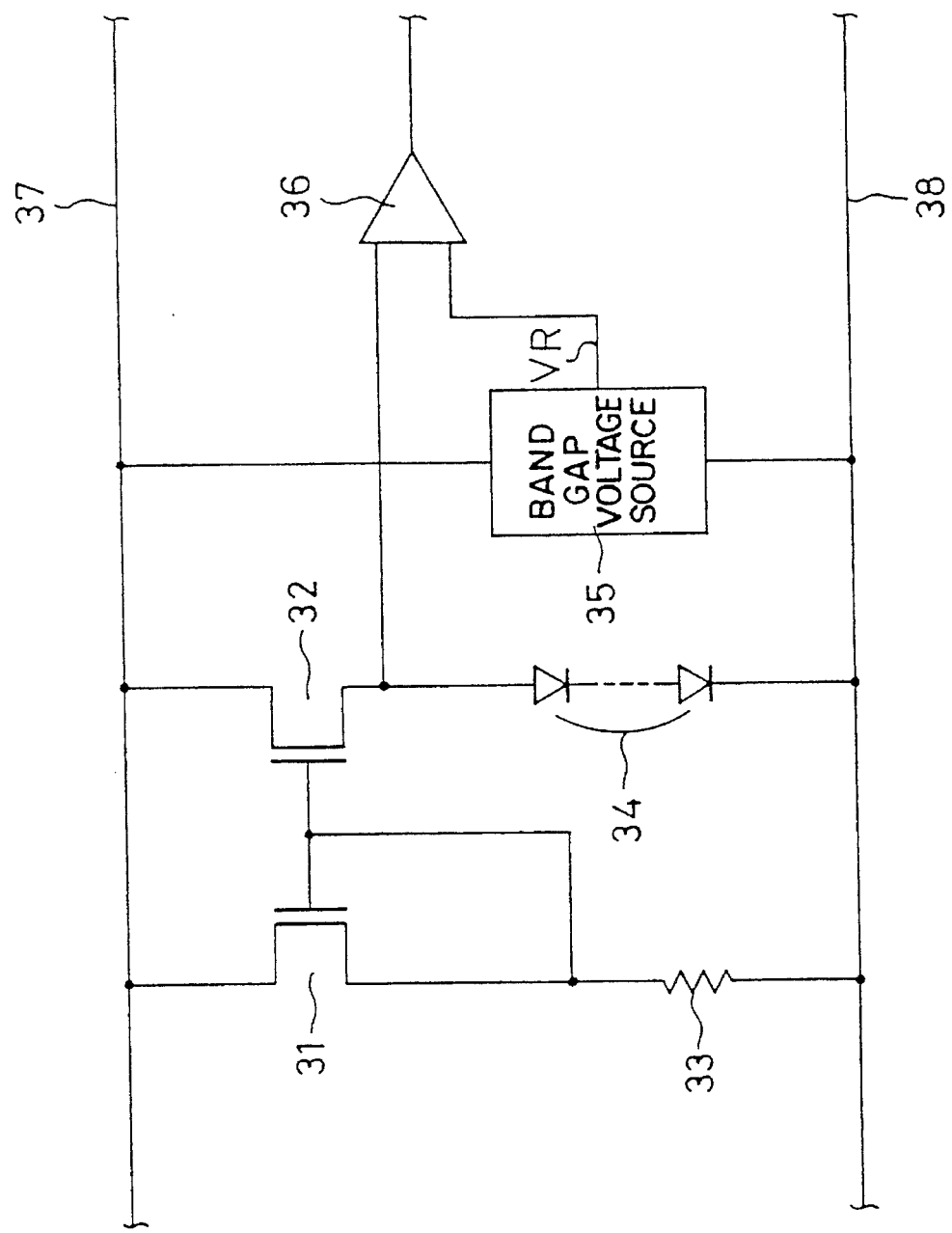
FIG. 3 is a diagram illustrating a circuit arrangement of a conventional overheat detecting circuit.

Next, a second embodiment of the present invention is described with reference to FIG. 2. As shown in FIG. 2, the second embodiment is obtained by replacing the diode 16 of the first embodiment of FIG. 1 by a resistance 21, and, in FIG. 2, the same reference numerals are assigned to the circuit elements having the same function as in FIG. 1. Incidentally, the description of the same circuit elements as in the first embodiment is omitted.

As shown in FIG. 2, the resistance 21 is connected to the drain terminal of MOSFET 14 which constitutes the output of the current mirror. Comparator 18 compares the dropping voltage of resistance 21 and the output voltage VR of the BGR circuit 17.

The resistances 15, 21 each have a different positive temperature coefficient and the temperature coefficient of the resistance 21 is highly set.

In the foregoing overheat detecting circuit, since the output voltage VR of the BGR circuit 17 has no temperature coefficient, a constant output voltage VR is always emitted independently of the ambient temperature and the power source voltage. Further, the dropping voltage V21 of the resistance 21 is given according to the following formula (6).

$$V_{21} = (V_R - V_T) \times R_{21}/R_{15} \qquad \text{formula (6)}$$

where: $V_T$ is the threshold voltage of MOSFET 11.

The relationship between the output voltage VR of the BGR circuit 17, which is applied to the comparator 18, and the dropping voltage $V_{21}$ of the resistance 21 is set as follows.

$$V_R > V_{21}$$

If the ambient temperature is increased, the value of the resistance 21 is increased, and the drop voltage $V_{21}$ is increased for constant current of the current mirror. When this drop voltage $V_{21}$ is increased more than the output voltage VR of the BGR circuit 17, the output of the comparator 18 is inverted and the overheating is detected.

By the condition at which the integrated circuit is manufactured, the output voltage $V_R$ of the BGR circuit 17 often has variable or dispersing values. In this case, the drop voltage $V_{21}$ of the resistance R21 will fluctuate in the same direction (that is, in-phase) according to the formula (6) as the direction in which the output voltage $V_R$ of the BGR circuit 17 fluctuates. As a result, the variation of the output voltage caused by the fluctuation of the input differential voltage $V_R$, $V_{21}$ of the comparator 18 is suppressed, and the fluctuation of the detected temperature can be suppressed to a minimum limit.

Although, in the foregoing embodiment, an embodiment using plus and minus power sources voltages, if one power source volage comprises a grounding reference power source, since the BGR circuit 17, first and second current mirror circuits MOSFET 11 through 14, comparator 18, circuit elements 16, 21 and the like perform the operation according to the present invention, they can be applied to the present invention.

As described above, according to the present invention, even if the variation of the overheating detection occurs at the output voltage of the BGR circuit due to the quality variation as encountered in manufacturing, since the input sources of the comparator both cause the fluctuation in the same directions, it is possible to suppress the variation of the detected temperature.

In consequence, the overheat detecting circuit according to the present invention is extremely effective in integrating a circuit great in power consumption or dissipation such as the motor driving circuit and the like.

What is claimed is:

1. An overheat detecting circuit for detecting overheating in a semiconductor integrated circuit, comprising:
   a band gap voltage source circuit connected between a positive power source line and a reference power source line for emitting a substantially constant voltage independent of a power source voltage and an ambient temperature;
   a constant current source circuit for generating a constant current in accordance with the constant voltage output from said band gap voltage source circuit;
   circuit elements each having a predetermined temperature coefficient and connected between an output terminal of said constant current source circuit and said reference power source line; and
   a comparator for comparing the constant voltage of said band gap voltage source circuit and a voltage generated by said circuit elements and outputting a digital signal.

2. The overheat detecting circuit as set forth in claim 1 wherein said circuit elements each having the predetermined temperature coefficient comprise diodes which are connected in series in predetermined number or at least one resistance.

3. The overheat detecting circuit as set forth in claim 1 wherein said constant current source circuit comprises a first current mirror circuit having an input terminal which is connected through a resistance to an output of said band gap voltage source circuit, and a second current mirror circuit having an input terminal which is connected to the output terminal of said first current mirror circuit.

4. The overheat detecting circuit as set forth in claim 3 wherein said circuit elements each having the predetermined temperature coefficient comprise diodes which are connected in series in predetermined number or a resistance.

5. The overheat detecting circuit as set forth in claim 1 wherein an output current of said constant current source circuit is changed according to a fluctuation of the output voltage, which is caused by a variation of an element characteristic of said band gap voltage source circuit so that said fluctuation is offset in an input differential voltage of said comparator.

6. The overheat detecting circuit as set forth in claim 1 wherein an output of said band gap voltage source circuit equals a voltage obtained by synthesizing a base-emitter junction voltage dependent voltage source having a negative temperature coefficient and a thermal voltage dependent voltage source having a positive temperature coefficient.

7. An overheat detecting circuit for detecting overheating in a semiconductor integrated circuit comprising:
   a band gap voltage source circuit for emitting a substantially constant voltage obtained by synthesizing a base-emitter junction voltage dependent voltage source having a negative temperature coefficient and a thermal voltage dependent type voltage source having a positive temperature coefficient;
   a constant current source circuit for generating a constant current in accordance with an output of said band gap voltage source circuit;
   circuit elements having a predetermined temperature coefficient and connected between an output terminal of said constant current source circuit and a reference power source; and a comparator for comparing the constant voltage of said band gap voltage source circuit and a voltage generated by said circuit elements.

8. The overheat detecting circuit as set forth in claim 7 wherein said circuit elements having the predetermined temperature coefficient comprise diodes which are connected in series in predetermined number.

9. The overheat detecting circuit as set forth in claim 8 wherein the voltage generated by said circuit elements at a room temperature is higher than an output voltage of said band gap voltage source circuit.

10. The overheat detecting circuit as set forth in claim 7 wherein said circuit elements having the predetermined temperature coefficient each comprise a resistance.

11. The overheat detecting circuit as set forth in claim 10 wherein said voltage generated by said circuit elements at a room temperature is lower than an output voltage of said band gap voltage source circuit.

12. The overheat detecting circuit as set forth in claim 7 wherein said constant current source circuit comprises a first mirror circuit having an input terminal which is connected through a resistance to an output of said band gap voltage source circuit, and a second current mirror circuit having an input terminal which is connected to an output terminal of said first current mirror circuit.

13. The overheat detecting circuit as set forth in claim 7 wherein an output current of said constant current source circuit is changed according to a fluctuation of the output voltage which is caused by a variation of an element characteristic of said band gap voltage source circuit so that said fluctuation is offset in an input differential voltage of said comparator.

14. The overheat detecting circuit as set forth in claim 7 wherein an output voltage of said band gap voltage source circuit is the voltage obtained by synthesizing the base-emitter junction voltage dependent voltage source having the negative temperature coefficient and the thermal voltage dependent type voltage source having the positive temperature coefficient.

* * * * *